United States Patent [19]

Sterzer

[11] 4,297,641
[45] Oct. 27, 1981

[54] SERRODYNING SYSTEM EMPLOYING AN ADJUSTABLE PHASE SHIFTING CIRCUIT

[75] Inventor: Fred Sterzer, Princeton, N.J.

[73] Assignee: RCA Corporation, New York, N.Y.

[21] Appl. No.: 80,103

[22] Filed: Sep. 28, 1979

[51] Int. Cl.³ .................................. H03B 19/00
[52] U.S. Cl. ........................ 328/15; 307/271; 328/140; 328/155; 333/139; 343/18 E
[58] Field of Search ............... 333/109, 139, 156; 328/135, 155, 158, 159, 15, 140; 307/262, 271; 363/9, 157; 343/18 E

[56] References Cited

U.S. PATENT DOCUMENTS

| 2,859,414 | 11/1958 | Lundry | 333/139 |
| 3,500,254 | 3/1970 | Mattingly et al. | 328/155 X |

FOREIGN PATENT DOCUMENTS

| 572895 | 9/1977 | U.S.S.R. | 333/139 |
| 668065 | 6/1979 | U.S.S.R. | 328/155 |

Primary Examiner—Paul L. Gensler
Attorney, Agent, or Firm—Samuel Cohen; Robert L. Troike; Raymond E. Smiley

[57] ABSTRACT

Two adjustable level signal translating devices in separate signal paths are arranged to receive an input alternating frequency signal and to pass the signal at respective desired levels to a vector summing circuit. One of the signal paths undergoes an additional 90° phase shift. The vector summing circuit produces an output signal shifted in phase by an amount between 0° and 90° relative to the input signal depending on the levels of signals from the two translating devices.

1 Claim, 4 Drawing Figures

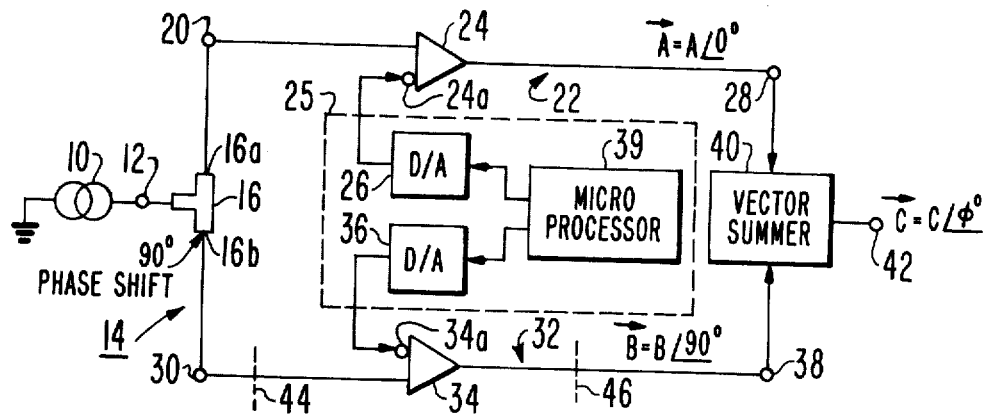
Fig. 1.
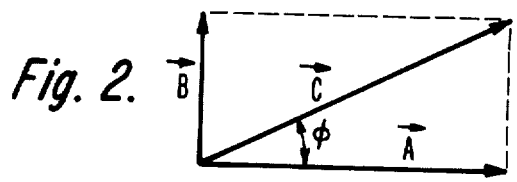
Fig. 2.
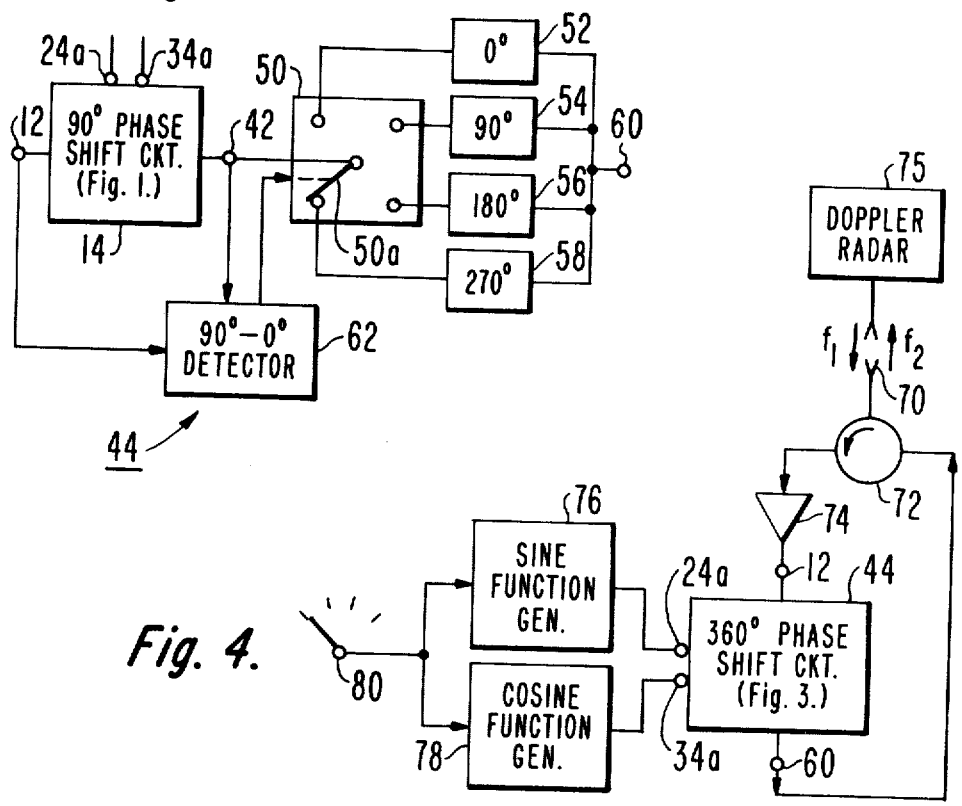

SERRODYNING SYSTEM EMPLOYING AN ADJUSTABLE PHASE SHIFTING CIRCUIT

The Government has rights in this invention pursuant to Contract No. N00017-79-C-0568 awarded by the Department of the Navy.

This invention relates to phase shifting circuits and more particularly to adjustable phase shifting circuits.

Phase shifting circuits are used for a number of diverse applications such as biphase modulation for secure communications, serrodyning and beam steering of phased array antennas. Conventional adjustable phase shifters of the travelling wave tube (TWT), PIN diode and ferrite types inherently suffer from a relatively high signal loss, and relatively slow response time of adjustment. Further, when used in serrodyning applications, a TWT produces a phase discontinuity when adjusted to the limits of its phase shifting capability.

In accordance with an embodiment of the present invention, an adjustable phase shifting circuit comprises first and second signal paths, each including an output terminal, an input terminal to which the frequency to be shifted is applied, and a variable level signal translating device with a level control terminal. Means are included for effecting a 90° phase shift in one signal path relative to the other and for producing a signal which is the vector sum of the signals appearing at the output terminals. A means is coupled to the control terminal of the variable level signal translating devices for respectively applying control signals to control the level of the signals produced at the output terminals for controlling the phase of the vector sum signal.

In the drawing:

FIG. 1 is an adjustable phase shifting circuit and control circuitry therefor in block diagram form in accordance with the instant invention;

FIG. 2 is a vector diagram useful in understanding the circuit of FIG. 1;

FIG. 3 is a 360° phase shifting circuit embodying the phase shifting circuit of FIG. 1; and FIG. 4 is a serrodyning system employing the phase shifter circuit of FIG. 3.

In FIG. 1 a suitable signal frequency source 10 is coupled to terminal 12 of a phase shifting circuit 14 in accordance with the present invention. Although the present invention is particularly useful at microwave frequencies, the principle is applicable to all frequencies. Terminal 12 is coupled to a power splitter 16 of conventional design, which may be a quadrature power splitter for both splitting power into equal portions and shifting the phase of the signal appearing at leg 16b by 90° relative to the phase of the signal in the other leg 16a. Leg 16a of power splitter 16 is coupled to one input terminal 20 while leg 16b is coupled to a second input terminal 30 of respective first and second signal paths 22 and 32. Terminal 20 is coupled to a first adjustable level signal translating device 24 while terminal 30 is coupled to a similar device 34. Devices 24 and 34 may be active or passive devices wherein the level (gain and/or attenuation) of a signal passing therethrough can be controlled while the signal is otherwise undisturbed (i.e., no distortion introduced). Signals applied at terminals 24a and 34a of devices 24 and 34, respectively, control the level change of signals applied to devices 24 and 34, respectively. Devices 24 and 34 may comprise vacuum tubes, bipolar transistors, single- or dual-gate field effect transistors (FETs). A dual-gate FET particularly suited to this application is described in "A Four-Eight GHz Dual Gate Amplifier" by J. Goel et al., 1978, IEEE International Solid State Circuits Conference, pp. 126–127. One gate of the FET is coupled to the input terminal 20 or 30 and the second is coupled to the control terminal 24a or 34a.

In FIG. 1 means within dashed block 25 for providing control signals to terminals 24a and 34a is shown as respective conventional digital-to-analog converters (D/A) 26 and 36 controlled by a suitable microprocessor 39. Depending on the particular system in which phase shifting circuit 14 is used, the adjustable means for providing the control signals may be manually adjustable voltage sources. Elements 26, 36 and 39 within dashed block 25 are not part of circuit 14 but rather control circuit 14 as will be described below.

The output of devices 24 and 34 are coupled to respective output terminals 28 and 38 of respective paths 22 and 32. Output terminals 28 and 38 are coupled to a means 40 for producing at phase shifting circuit output terminal 42, the vector sum $\vec{C} = C\angle\phi°$ of signal $\vec{A}$ appearing at terminal 28 and signal $\vec{B}$ appearing at terminal 38. One conventionally available device for producing both a vector sum and the 90° phase shift at microwave frequencies is a coaxial hybrid junction such as the Narda Microwave Corporation models 3029–3035 positioned in place of device 40. When such a hybrid junction is employed, splitter 16 will not have the phase shifting capability. Alternatively, the 90° relative phase shift above-described as occurring in splitter 16 or summer 40 may be affected at other locations in phase shifter circuit 14 such as at a location 44 between terminal 30 and device 34 or at location 46 between device 34 and terminal 38. Thus, the location of the 90° phase shifting means is not critical so long as it occurs somewhere in either path 22 or 32 or in one leg of device 16 or device 40.

In operation, signal frequency source 10 produces a signal of given frequency and amplitude which is applied at terminal 12 to phase shifting circuit 14. The signal is split into signals of equal power appearing at terminals 20 and 30 with a relative phase shift of 90° of the signal appearing at terminal 30 relative to that at terminal 20, assuming that the 90° phase shift occurs in splitter 16. The signal at terminal 20 is applied to one gate of a dual-gate amplifier 24 or to another adjustable level shifting device which produces a vector signal $\vec{A} = A\angle 0°$ where A represents the amplitude of the signal which is at a relative angle of 0°. The magnitude or level of signal A is set by adjusting the control signal produced by a means 26 and applied at terminal 24a. Similarly, the signal at terminal 30 is applied to device 34 which provides a vector signal $\vec{B} = B\angle 90°$ where B represents the amplitude of the signal produced by device 34 which is at a relative angle of 90°. (If the 90° phase shifter circuit is at some other point than splitter 16 then the 90° shift will of course occur at that point.) The magnitude or level of the signal B is adjusted by setting the adjustable signal produced by means 36 and applied at terminal 34a.

In response to signal $\vec{A}$ and $\vec{B}$, summer 40 produces at terminal 42 the vector sum thereof $\vec{C} = \vec{A} + \vec{B} = C\angle\phi° = |C| TAN^{-1} B/A$ where the relationship $\vec{A}$, $\vec{B}$, $\vec{C}$ and $\phi$ is as illustrated in FIG. 2. Thus, C is the resultant voltage amplitude and $\phi$ the phase angle of the signal produced at terminal 42. For example, where A is relatively large and B is relatively small (at or nearly at zero) $\vec{C} \cong A\angle 0$; where B is relatively large and A is relatively small (at or nearly at zero) $\vec{C}=\vec{B}\angle 90$; where $A=B$, $C=1.4A\angle 45°$. The output phase angle is, therefore, controlled by adjusting the relative amplitudes of the quadrature vectors $\vec{A}$ and $\vec{B}$. In a situation in which devices 24 and 34 are dual-gate FETs, this is accomplished by independently adjusting the gain of each of the dual-gate FET amplifiers. For most system requirements, the absolute amplitude of the resulting phase shifted RF wave must be kept constant, independent of the selected output angle. That is, the magnitude of C is invariant and the phase angle is therefore selected by controlling the amplitudes of both waves A and B such that $A=C$ cosine $\phi$ and $B=C$ sine $\phi$. Therefore the phase angle $\phi$ can be rotated to a total of 90° for the basic phase shifter described by merely controlling by means of microprocessor 39 or other suitable means, the amplitude of both quadrature waves to the output vector summer 40. Because the two signals $\vec{A}$ and $\vec{B}$ are added in a linear circuit 40, no harmonics will be generated by the summation process.

As illustrated in FIG. 3, the adjustable phase shifting circuit of FIG. 1 can be combined with other circuitry of conventional design to form an adjustable 360° phase shifting circuit. Phase shifting circuit 14 is coupled at terminal 42 to the arm 50a of a four position or four pole electronic switch 50 which may be any type of switch suitable for the particular frequencies involved. The four poles of switch 50 are coupled, respectively, to conventional fixed phase shift circuits 52, 54, 56 and 58 of 0°, 90°, 180° and 270° (−90°). The fixed phase shift circuits are couplled to a common output terminal 60. "Phase shift circuit" 52 of 0° does not provide any phase shift but rather provides proper isolation from terminal 60 and provides a delay equal to the delays of the other fixed phase shift circuits 54, 56 and 58. Switch arm 50a may be advanced by any suitable means. As an example, where the adjustable 360° phase shifter 44 is used for serrodyning and thus there is produced at terminal 60 a signal shifted continuously through the full 360° range relative to the signal applied to terminal 12, a detector 62 may be coupled to terminals 12 and 42 for detecting a shift in phase shifting circuit 14 from 90° back to 0° for advancing arm 50a to the next position or pole. Alternatively, the means for producing signals at control terminals 24a and 34a such as D/A 26, 36 and microprocessor 39, may be utilized to advance arm 50a when phase shifting circuit 14 advances from 90° to 0°.

Phase shifting circuit 44 may be used in the serrodyning circuit as illustrated in FIG. 4 to which attention is now directed. A common transmit-receive antenna 70 of conventional design is coupled to a circulator 72 also of conventional design. The circulator 72 is coupled to an amplifier 74 for amplifying a signal from a suitable source such as a conventional doppler radar 75 at frequency $f_1$ incident on antenna 70. Amplifier 74 is coupled to terminal 12 of phase shifting circuit 44. Terminal 60 of the phase shifting circuit is coupled to the circulator 72 to provide a signal for transmitting by antenna 70 at frequency $f_2$. A sine generator 76 of conventional design and a similar cosine generator 78 are coupled to respective terminals 24a and 34a of phase shifting circuit 44 for producing sine wave signals offset by 90°. A suitable means 80 sets the frequency of the sine and cosine generators and assures that they operate in synchronization. They are operated continuously to cause a continuous shift of phase shifter 44 from 0° to 360°.

Operation of the circuit of FIG. 4 will be described in connection with the following equations. Assume an rf signal $$X = X_o \sin(wt + \theta) \tag{1}$$

where $X_o$ is the amplitude of the signal, $w=2\pi f$, $t=$ time and $\theta$ is the relative phase angle of the signal. The signal X acted upon by a phase shifting circuit such as 44 adapted to increase or decrease the phase shift of the signal such that $$\theta = Kt \tag{2}$$

where K is the constant determined by the rate at which $\theta$ changes then $$X = X_o \sin[(w+K)t] \tag{3}$$

from which it will be noted that the frequency of the rf signal X is shifted or "serrodyned" by an amount equal to K. Thus, if sine and cosine function generators 76 and 78 are set by means 80 to operate at a period of K, the frequency of the signal $f_1$ will be shifted or serrodyned to frequency $f_2 = f_1 \pm 1/K$ and may be thus used to provide a false doppler signal.

Such a system as illustrated in FIG. 4 may be used any time that it is desired to alter the apparent speed of the vehicle on which the system is mounted relative to speed determining doppler type radar.

I claim:

1. A phase shifting circuit for producing an output signal adjustably shifted in phase relative to an input alternating frequency signal, comprising in combination:

a first signal path having an input terminal receptive of said input signal and having a first output terminal, said first signal path comprising a first adjustable level signal translating device including a first level control terminal, said device being positioned intermediate said input terminal and output terminal;

a second signal path having an input terminal receptive of said input signal and having a second output terminal, said second signal path comprising a second adjustable level signal translating device including a second level control terminal;

means for effecting a 90° relative phase shift in one signal path relating to the other;

means coupled to said first and second output terminals for producing said output signal which is the vector sum of the signals appearing at said first and second output terminals;

means coupled to said first and second control terminals for respectively applying control signals thereto for controlling the level of signal produced respectively at said first and second output terminals for controlling the phase of said output signal by any amount between 0° and 90° relative to said input signal;

means for selectively shifting said output signal by N·90° where N=0, 1, 2, or 3 for thereby effecting a 0° to 360° phase shift relative to said input signal; and means for providing to said phase shifting circuit a signal at a given frequency $f_1$, means for continuously and uniformly shifting the phase of said signal in said phase shifting circuit between 0° and 360° and means responsive to said output signal from said phase shifting circuit for producing a signal at frequency $f_2$ where $f_2$ differs from $f_1$ by an amount determined by the rate at which said phase shift occurs in said phase shifting circuit.

* * * * *